United States Patent [19]
Dresner

[11] Patent Number: 5,195,010
[45] Date of Patent: Mar. 16, 1993

[54] ELECTROSTATIC DISCHARGE VOLTAGE PROTECTION CIRCUIT FOR A SOLID STATE INSTRUMENT

[75] Inventor: Joseph Dresner, Princeton, N.J.

[73] Assignee: Thomson, S.A., Courbevoie, France

[21] Appl. No.: 468,510

[22] Filed: Jan. 23, 1990

[51] Int. Cl.$^5$ ............................................. H02H 9/04
[52] U.S. Cl. ..................................... 361/56; 361/58; 361/111; 257/2; 257/356
[58] Field of Search .................... 361/120, 111, 56, 58, 361/128, 91; 357/23.13, 2, 57; 313/325

[56] References Cited

U.S. PATENT DOCUMENTS

| | | |
|---|---|---|
| 4,322,777 | 3/1982 | Ueta et al. ............................ 361/397 |
| 4,438,365 | 3/1984 | Atkinson ............................. 361/120 |
| 4,527,213 | 7/1985 | Ariizumi ............................. 361/56 |
| 4,763,184 | 8/1988 | Krieger et al. .................... 357/23.13 |
| 4,875,130 | 10/1989 | Huard ............................... 357/23.13 |

Primary Examiner—Todd E. DeBoer
Attorney, Agent, or Firm—J. S. Tripoli; D. H. Irlbeck; L. L. Hallacher

[57] ABSTRACT

A protection circuit for a solid state instrument includes a plurality of fuses and a switching device arranged in parallel with the input capacitance of the solid state instrument, The fuses protect the instrument from high voltage surges, and the switching device protects the instrument from lower voltage surges. The fuses and the switching device are solid state devices and thus can be fabricated along with the solid state instrument.

16 Claims, 1 Drawing Sheet

U.S. Patent  Mar. 16, 1993  5,195,010 ical discharge protection circuit for a solid state instrument and particularly to such a circuit in which the protection components are solid state devices.

ELECTROSTATIC DISCHARGE VOLTAGE PROTECTION CIRCUIT FOR A SOLID STATE INSTRUMENT

BACKGROUND

This invention relates generally to an electrostatic discharge protection circuit for a solid state instrument and particularly to such a circuit in which the protection components are solid state devices.

Solid state devices, such as active matrix liquid crystal display devices, are subject to damage from high electrostatic discharges, such as human body discharges (HBD). Human body discharges frequently are in the order of 2,000 to 2,500 volts, and can be as high as 10,000 volts. Voltages of these levels are capable of destroying the solid state devices within instruments which do not include some means for protection against such discharges. Effective electrostatic voltage discharge protection must be capable of protecting the solid state instrument from both low and high voltage discharges, and the switching time of the protecting devices must be sufficiently rapid to ensure that the discharges are shunted to ground prior to damaging the protected instrument. The switching devices must also be capable of protecting the solid state instrument against multiple electrostatic discharges to which the instrument may be subjected during its useful life time. The present invention fulfills these needs.

SUMMARY

A protection circuit for protecting a solid state instrument from electrostatic voltage discharges includes a plurality of solid state fusing devices arranged in parallel with the input capacitance of the solid state instrument, the fusing devices protect the instrument from electrostatic discharges above a minimum voltage. A solid state switching device is arranged in parallel with the fuses for shunting currents produced by voltage discharges below the minimum voltage.

DETAILED DESCRIPTION

Figure 1:
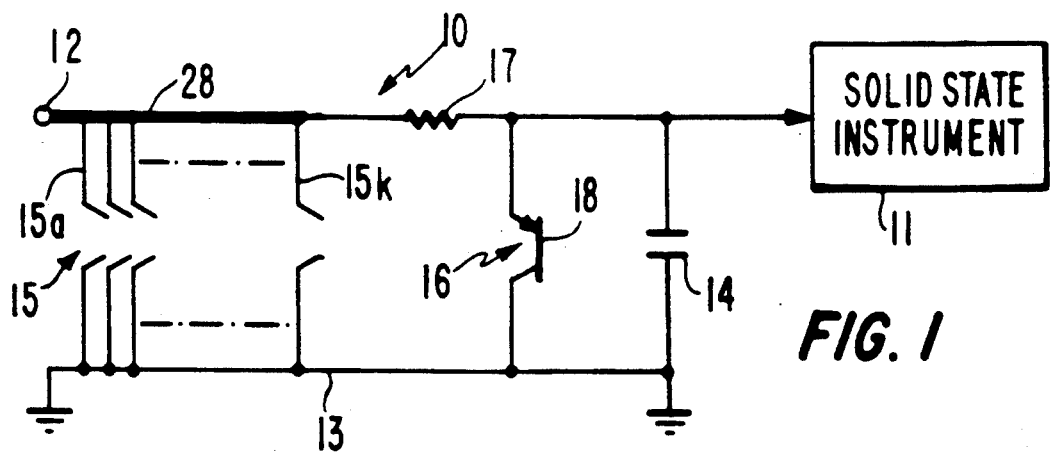
FIG. 1 is a preferred embodiment of an electrostatic voltage discharge protection circuit.

In FIG. 1, a protection circuit 10 protects a solid state instrument 11 from electrostatic voltage discharges, for example, human body discharges (HBD's) which are caused by electrostatic electricity building up on the user of the solid state instrument 11. Human body discharges can be as high 10,000 volts, although most tend not to exceed 2,500 volts. The solid state instrument 11 can be a liquid crystal display device having solid state driving circuitry which is used to switch the various pixels of the display device on and off in accordance with the desired display. The protection circuit 10 includes an input line 12 which applies the display producing signal to the solid state instrument 11. The circuit 10 also includes a ground line 13. The input capacitance of the solid state instrument 11 is represented by a capacitor 14 arranged between the input line 12 and the grounded line 13. A plurality of substantially identical fusing devices 15a through 15k are arranged in parallel with the input capacitance 14 of the solid state instrument 11. Additionally, a solid state switching device 16, which preferably is a thin film transistor (TFT), operating with the gate floating is also arranged in parallel with the input capacitance 14. A resistor 17 is arranged in the input line 12, and in combination with the input capacitance 14 of the solid state instrument 11, has a value selected such that the RC time constant of the resistance-capacitance network ideally is less than the turn on time of the TFT 16 and greater than the firing time of fusing devices 15a to 15k. In practice, RC is made as large as possible, consistent with the maximum frequency of the signal applied to input terminal 12. When the solid state instrument 11 is a liquid crystal display device, every pixel within the display device is a capacitor which contributes to the input capacitance 14 and accordingly the value of the resistor 17 is affected by the number of pixels within the display.

The fusing devices 15a to 15k are solid state devices and are used to protect the solid state instrument 11 from electrostatic voltage discharges above a predetermined voltage, such as 300 volts. A plurality of the fusing device 15a to 15k is used because human body discharges above a maximum level will cause one of the devices to break down (blow). In such an event the breakdown of one of the fuses will protect the solid state instrument 11 from damage. The other fusing devices in the circuit continue to provide protection to the solid state instrument 11 from subsequent discharges above the breakdown level of the fusing devices. The switching device 16 is a thin film transistor having a gate 18 which floats. The TFT 16 protects the solid state instrument 11 from electrostatic voltage discharges which are below the minimum voltage at which the fuses 15a to 15k protect the instrument 11. Only once TFT is needed because any electrostatic voltages of sufficient magnitude to destroy the TFT are shunted by the fusing devices 15a to 15k. The instrument 11 therefore is afforded lifetime protection against electrostatic voltage discharges of all levels capable of damaging the internal circuitry of the instrument.

Figure 3:
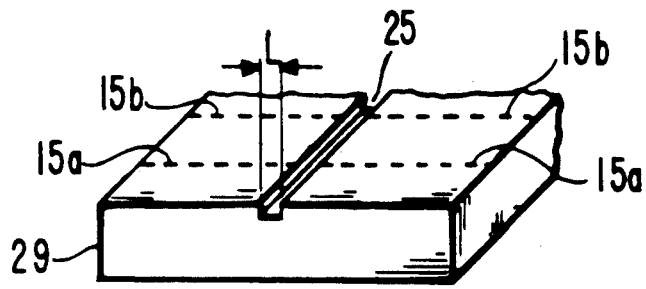
FIG. 3 is a simplified showing of a plurality of the preferred embodiment protection devices arranged in a single solid state strip.
Figure 2:
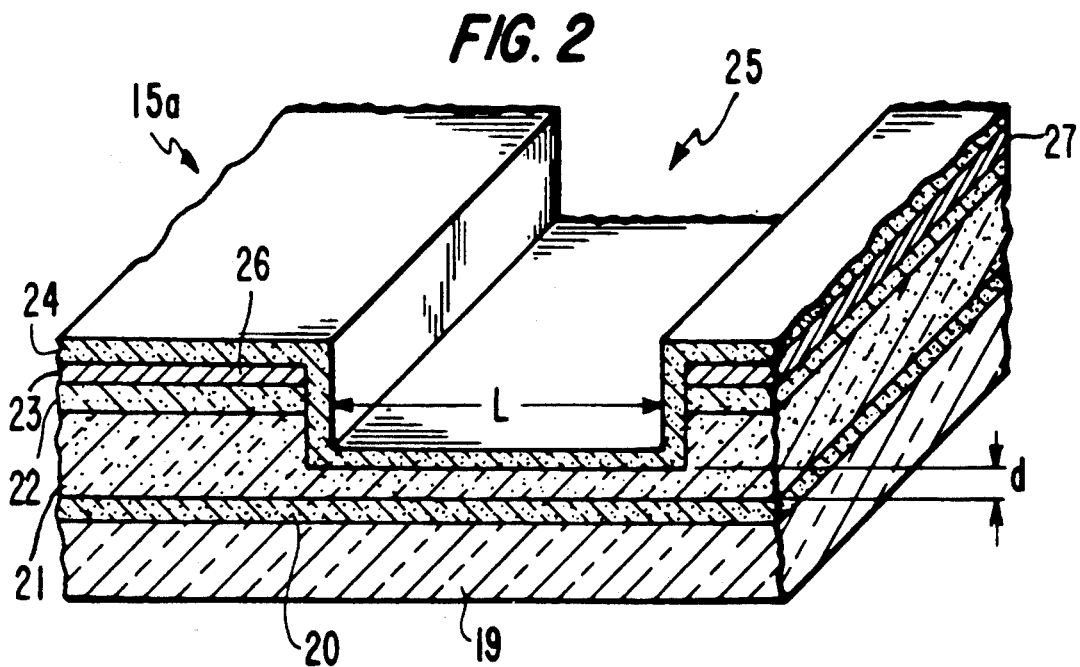
FIG. 2 is a cross section of a preferred embodiment of one of the protection devices of the preferred embodiment.

As shown in FIG. 2, the fusing devices 15a to 15k are amorphous silicon (a-Si) solid state devices. The fusing devices 15a to 15k are fabricated on a glass substrate 19. A layer 20 of silicon nitride $Si_3N_4$ overlays the glass substrate. A layer 21 of undoped amorphous silicon overlays the $Si_3N_4$ layer 20. A layer 22 of doped amorphous silicon is then placed over the undoped layer 21. Preferably layer 21 is an n-doped material, although p-type materials also could be used. An electrode layer 23, which preferably is molybdenum, is deposited over the doped amorphous silicon layer 22. A channel 25 is etched, or otherwise provided, into the device 15a to a depth such that the bottom of the channel is spaced a distance d from the $Si_3N_4$ layer 20. Finally, an upper layer 24 of $Si_3N_4$ is deposited across the entire upper surface of the fuse 15a including the channel 25. The dimensions L across the channel 25, as well as the distance d of the $Si_3N_4$ layer 24 from the other $Si_3N_4$ layer 20, are instrumental in determining the breakdown voltage of the fusing devices 15a to 15k. Additionally, the thickness of the $Si_3N_4$ layers 20 and 24 are also important. A dimension W, which is the full width parallel to channel 25 is not shown because FIGS. 2 and 3 are broken away. However, W is dependent upon the current loading at terminal 12 and thus is determined by the nature of instrument 11. The important dimensions of the device therefore are as follows.

The $Si_4N_4$ layer 20, 2000 Å to 4000 Å with 3000 Å preferred.
The $Si_3N_4$ layer 24, 1000 Å to 4000 Å with 1500 Å preferred.
d = 300 Å to 2000 Å, with 1000 Å preferred.
$L \leq \mu m$
$W = 100 \ \mu m$ to 4,000 $\mu m$ The electrode layer 23 is formed on the a-Si layer 22 in a pattern of parallel lines all of which are interrupted by the channel 25. The spacing between the conductive lines exceeds the length L of the channel 25 to prevent discharges between adjacent lines when an electrostatic discharge occurs. The fusing devices 15a–15k are connected into the circuit 10 by connecting a portion 26 which is on one side of channel 25 to bus bar 28 of circuit 10 Another portion 27 of the conductive lines, which is on the other side of channel 25, is connected to ground line 13. The bus bar 28 is made of the same material as the parallel conductors and the other conductors in circuit 10. However, bus bar 28 is wider than all the other conductors in the circuit. The extra width maintains the continuity of the bus bar when one of the fusing devices 15 blows. A large electrostatic discharge otherwise would melt both the bus bar and the fusing conductor at the junction where they are coupled. The width of bus bar 28 preferably is at least four times the width W of the conductors 15.

When one of the fusing devices 15a to 15k is subjected to an electrostatic charge which is sufficiently high to cause the fuse to blow, the upper layer 24 of $Si_3N_4$ causes the undoped amorphous silicon layer 21 to blow out through the molybdenum electrode and the upper layer 24 thereby preventing the metal from the conductive electrode 23 from falling back into the blown portion and permanently shorting the fusing device. Such shorting, if it should occur would render the solid state instrument 11 inoperative because the input line 12 would be shorted to ground. Accordingly, the device is particularly advantageous because the permanent blowing of one of the fusing devices 15a to 15k does not render the high voltage protection ineffective until all of the devices are blown; an occurrence which is very unlikely during the lifespan of the instrument 11. The protection circuit 10 is only rarely subjected to eletrostatic discharges of sufficient magnitude to blow one of the fusing devices and accordingly, the protective circuit 10 typically offers permanent high voltage protection to the solid state instrument with which it is associated.

FIG. 3 shows how a plurality of the buses 15 is arranged in a single solid state member 29, only a portion of which is shown. Two conductors 15a and 15b, shown in phantom, are interrupted by channel 25. The spacing between conductors 15a and 15b exceeds the dimension L across channel 25. When input terminal 12 is subjected to an electrostatic charge of sufficient magnitude one of the fuses 15a to 15k fires across channel 25 and blows the fuse and thus prevents the instrument 11 from being damaged by the electrostatic discharge.

The thin film transistor 18 which serves as the solid state switching device is constructed identically to the fusing devices 15a to 15k except that a gate electrode (not shown in FIG. 2) is applied to the bottom of the channel 25 prior to the application of the upper $Si_3N_4$ layer 24. The formation of the thin film transistor 18 therefore does not require any additional processing steps. The important dimensions of the TFT 18 are as follows:

$L \geq 10 \ \mu m$ with 12 $\mu m$ preferred.
$W = 100 \ \mu m$ to 600 $\mu m$ with 200 $\mu m$ preferred.
d = is the same for the TFT 18 and the fuses 15a and 15k to avoid the need for additional processing steps.

What is claimed is:

1. A protection circuit having an input line and a ground line for protecting a solid state instrument from electrostatic discharges comprising:
   a plurality of solid state fusing devices arranged in parallel between said input line and said ground line, the input capacitance of said solid state instrument also being arranged between said input line and said ground line, said fusing devices protecting said instrument from electrostatic discharges above a minimum voltage;
   a solid state switching device arranged in parallel with said input capacitance for shunting currents produced by electrostatic discharges below said minimum voltage; and
   a resistor in combination with said input capacitance, said resistor having a value whereby the RC time constant of said resistor and said input capacitance is higher than the switching time of said fusing devices and said switching device.

2. The protection circuit of claim 1 wherein said fusing devices are amorphous silicon devices.

3. The protection circuit of claim 2 wherein said solid state switching device is an amorphous silicon thin film transistor.

4. The protection circuit of claim 3 wherein said thin film transistor has a floating gate.

5. The protection circuit of claim 4 wherein said solid state instrument is a liquid crystal display device.

6. The protection circuit of claim 1 wherein said solid state fusing devices are arranged in a single solid state strip, and
   wherein said solid state fusing devices are amorphous silicon devices.

7. The protection circuit of claim 6 wherein said solid state switching device is an amorphous silicon thin film transistor.

8. The protection circuit of claim 7 wherein said solid state instrument is a liquid crystal display device.

9. A protection circuit including a plurality of parallel fusing devices each of said fuzes comprising: an insulative substrate;
   a first layer of $Si_3N_4$ overlying one surface of said substrate;
   a second layer of undoped semiconductor material overlying said first layer;
   a third layer of doped semiconductor material overlying said second layer;
   a conductive electrode overlying said third layer;
   a channel, having a dimension L, extending through said conductive electrode and said third layer and extending partially through said second layer, whereby the bottom of said channel lies within the distance d of said first layer; and
   a fourth layer of $Si_3N_4$ overlying said third layer and said channel.

10. The protection circuit of claim 9 wherein said fusing devices are arranged in a single solid state strip, and wherein said dimension L is selected such that said fusing devices are protection against electrostatic discharges above a minimum voltage.

11. The protection circuit of claim 10 wherein said thin film transistor is protection against electrostatic discharges below said minimum voltage.

12. The protection circuit of claim 11 wherein said semiconductor material is amorphous silicon.

13. The protection circuit of claim 9 wherein said semiconductor material is amorphous silicon.

14. A solid state fusing device comprising:
an insulative substrate;
a first layer of $Si_3N_4$ overlying one surface of said substrate;
a second layer of undoped semiconductor material overlying said first layer;
a third layer of doped semiconductor material overlying said second layer;
a conductive electrode overlying said third layer;
a channel, having a dimension L, extending through said conductive electrode and said third layer and extending partially through said second layer, whereby the bottom of said channel lies within the distance d of said first layer; and
a fourth layer of $Si_3N_4$ overlying said third layer and said channel.

15. The device of claim 14 wherein said dimension L is selected such that said fusing devices are protection against electrostatic discharges above a minimum voltage.

16. The solid state fusing device of claim 14 wherein said semiconductor material is amorphous silicon.

* * * * *